United States Patent [19]
Lampel

[11] Patent Number: 6,087,906
[45] Date of Patent: Jul. 11, 2000

[54] ABSORBENT AMPLITUDE FILTER

[75] Inventor: Peter Lampel, Unterschleissheim, Germany

[73] Assignee: Siemens Aktiengesellschaft, Munich, Germany

[21] Appl. No.: 09/099,016

[22] Filed: Jun. 17, 1998

[30] Foreign Application Priority Data

Jun. 19, 1997 [DE] Germany .......................... 197 26 070

[51] Int. Cl.[7] ................................................. H03H 7/01
[52] U.S. Cl. ...................... 333/17.2; 333/81 A; 333/174
[58] Field of Search ............................. 333/17.2, 81 A, 333/167, 174, 204–207, 262

[56] References Cited

U.S. PATENT DOCUMENTS

| | | | |
|---|---|---|---|
| 3,859,609 | 1/1975 | Couvillon et al. .................... | 333/81 A |
| 4,267,538 | 5/1981 | Assal et al. .............................. | 333/262 |
| 4,951,008 | 8/1990 | Vedrenne et al. ...................... | 333/17.2 |
| 5,126,701 | 6/1992 | Alderstein .............................. | 333/17.2 |
| 5,408,204 | 4/1995 | Feldle et al. ........................... | 333/17.2 |

*Primary Examiner*—Paul Gensler
*Attorney, Agent, or Firm*—Hill & Simpson

[57] ABSTRACT

An absorbent amplitude filter for HF signals employs a reflective filter and an absorption circuit comprising a load resistor. The absorption circuit inventively comprises another $\lambda/4$ line upstream of the filter, which comprises, at the input side, a series connection consisting of another diode and the load resistor. This series connection is connected with the reference potential, whereby an HF block is connected in parallel to the load resistor.

2 Claims, 1 Drawing Sheet

ABSORBENT AMPLITUDE FILTER

BACKGROUND OF THE INVENTION

1. Field of the Invention

The present invention relates generally to the field of telecommunications. More particularly, the present invention relates to an improved RF amplitude filter.

2. Description of the Related Art

Amplitude filters are used to protect sensitive receiving amplifiers, such as, for example, an LNA or Low Noise Amplifier which are particularly useful for phase controlled antennas. The receiving amplifiers in transmitter-receiver modules, what are known as T/R modules must be protected from high power signals. The transmission and the reception frequency of such systems lie in the radio frequency X band, for example. Average powers of one watt and peak powers of 10 watts are made available by a transmitting amplifier (HPA, High Power Amplifier). Consequently, high power reception signals can enter the input of the receiving amplifier.

There are three different modes of operation for the amplitude filters which are: 1) the pass mode (Low Insertion Loss Receive Mode) which is used for the reception of weak signals; 2) the filtration mode (High Insertion Loss Receive Mode) that is used in the reception of signals with high power; and 3) the block mode or Isolation Mode that may be selected from outside through a control signal and which serves to isolate the receiving amplifier from the antenna.

It is absolutely crucial that an absorbent amplitude filter absorb the received signal while in the filtration mode and block mode. The signal must not be reflected back to the input of the circuit.

There are two possibilities for realization of such an absorbent filter. The basis for both cases is what is known as a reflective amplitude filter consisting of a λ/4 line and preferably two PIN diodes. The two PIN diodes are respectively connected at the input and output sides opposite a reference potential.

In the first design, before the input of the reflective filter, a switch is connected at whose first input the antenna is connected, and at whose second input the receiving amplifier is connected through the filter. The third terminal of the switch is connected to a load resistor. This load resistor absorbs the reflected signal.

In the second design, the received signal is split with a first power splitter into preferably two equal parts and merged again at the output with a second power splitter. Two reflective amplitude filters are located in-line between the two power splitters. In the pass mode, the two subsignals pass through the filter undisturbed. In the filtration mode and the block mode, the two subsignals of the reception signal are reflected with a phase difference of 180 degrees. No signal power is therefore reflected back to the input of the circuit.

It is an object of the invention to provide a filter which is both physically small and which requires few electrical components. Other objects and advantages of the present invention will be apparent from the following Summary and Detailed Description of the Preferred Embodiments.

SUMMARY OF THE INVENTION

One particular advantage of the inventive circuit is the savings in space, weight and components. Compared to the first design, the switch can be omitted, which leads to a savings in weight and cost. Compared to the second design, the two power splitters are omitted, which leads to a savings in both cost and space.

BRIEF DESCRIPTION OF THE DRAWINGS

The invention is described using an exemplifying embodiment depicted in the drawing wherein.

DETAILED DESCRIPTION OF THE PREFERRED EMBODIMENTS

Figure 1:
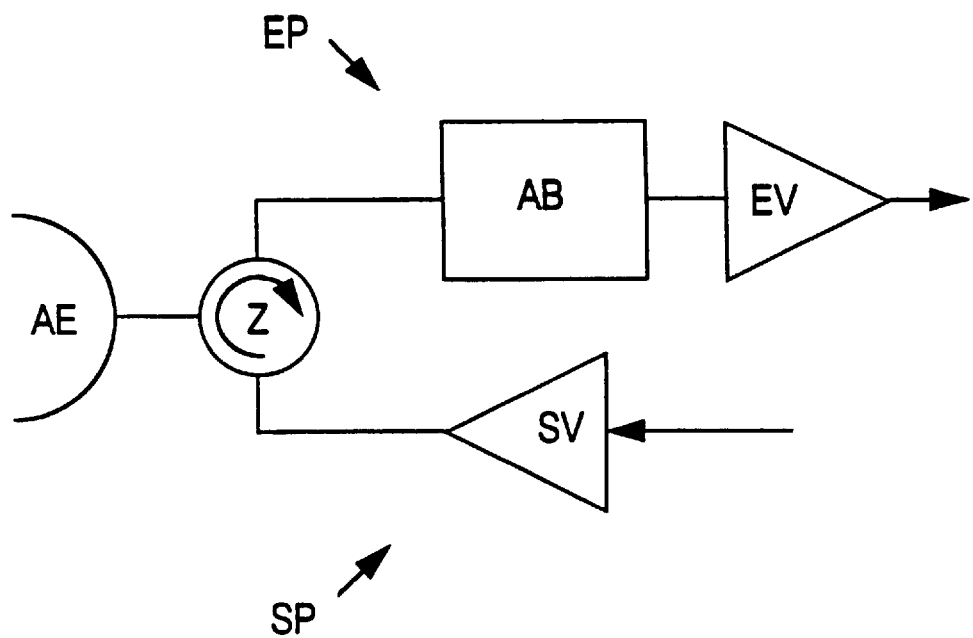
FIG. 1 illustrates a transmitter/receiver circuit for a phase controlled antenna.
Figure 2:
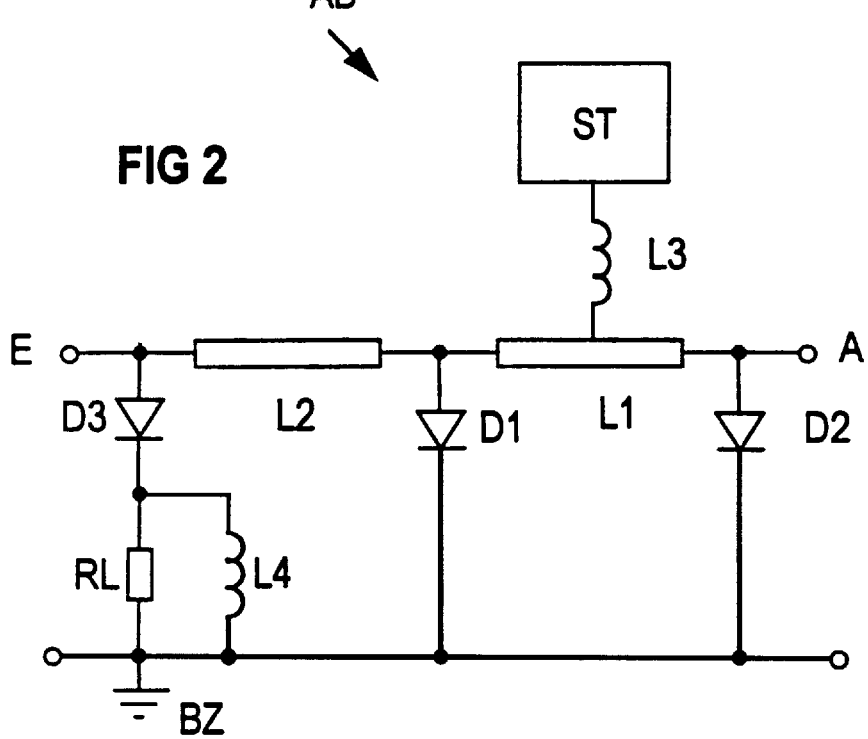
FIG. 2 illustrates the amplitude filter of the present invention.

A transmitter/receiver module illustrated in FIG. 1 comprises a transmission path SP and a reception path EP. The transmission path SP and the reception path EP are connected to two inputs of a circulator Z, at whose third input an antenna element, or radiator element AE is connected. A transmitting amplifier SV is provided in the transmission path SP. The received signal reaches a receiving amplifier EV in the reception path EP via an amplitude filter AB. FIG. 2 depicts the absorbent amplitude filter AB.

This amplitude filter AB comprises a λ/4 line L1 connected between an input port E and an output port A. The end of the conductor L1 at the input side is connected with a reference potential BZ via a PIN diode D1. The end of the conductor L1 at the output side is connected with the reference potential BZ via a PIN diode D2. The conductor L1 is further connected with a control unit ST via an HF block L3.

These circuit parts represent a reflective amplitude filter which is known and which can be additionally switched over between a pass mode and block mode via the control unit ST. A simple reflective filter switches automatically between the pass mode and filtration mode, dependent on the power of the input signal. In an expansion of this filter, a block mode is set from outside by a control voltage.

This reflective filter is inventively expanded into an absorbent filter by another diode D3—likewise a PIN diode, for example—another λ/4 line L2, a load resistor RL and another HF block L4. The λ/4 line L2 is connected between the input port E and the end of the line L1 at the input side. The end of the line L2 at the input side, i.e. the input port E, is connected with the reference potential BZ via a series connection of the diode D3 and the load resistor RL. A point between the diode D3 and the load resistor RL is connected with the reference potential BZ via the HF block L4.

In the pass mode, the received signal at the input port E is thereby conducted to the output port A. In the filtration mode and block mode, it is conducted to the load resistor RL. For input signals with low power, the diodes D1, D2, and D3 are of high impedance, and the input signal reaches the output post A with only low losses.

The two diodes D1 and D2 are brought into a low-impedance state by means of a positive voltage. This voltage is emitted by the control unit ST or by means of an input signal with high power at the input port E. A diode D1 switched to low impedance effects a high input resistance for HF signals at the end of the conductor L2 at the input side.

When diodes D1 and D2 are switched to low impedance, the HF input signal is reflected. For the HF signal, the diode D3 is in fact connected in series with the load resistor RL. However, for a DC voltage, it is connected to the reference potential BZ via the HF block L4. In that case, the load resistor RL is shorted. The diode D3 thereby becomes low-impedance also. The low impedance of the diode D1 is transformed to a high impedance by the line L2 in the plane of reference of the diode D3. The input signal is thereby conducted via the diode D3 to the load resistor RL, where it is absorbed.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. An amplitude filter for high frequency signals, said amplitude filter having an input port and an output port having a circuit path therebetween, comprising:

a reflective amplitude filter having:

a first $\lambda/4$ line having an input side and an output side in said circuit path, said output side coupled to said output port;

a first diode connected between said input side of said first $\lambda/4$ line and a reference potential; and a second diode connected between said output side of said first $\lambda/4$ line and said reference potential; and an absorption circuit for absorbing a high power signal received at said input port having:

a second $\lambda/4$ line in said circuit path, said second $\lambda/4$ line being connected between said input port and said input side of said first $\lambda/4$ line;

a third diode connected in series between said input port and a load resistor being in turn connected to said reference potential; and an HF block connected in parallel to said load resistor.

2. The amplitude filter according to claim 1, further comprising a control unit connected to said first $\lambda/4$ line through a second HF block, so that said amplitude filter can be switched between a pass mode and a block mode.

* * * * *